(12) United States Patent
Giridhar et al.

(10) Patent No.: US 9,275,702 B2
(45) Date of Patent: Mar. 1, 2016

(54) MEMORY CIRCUITRY INCLUDING READ VOLTAGE BOOST

(71) Applicant: The Regents of the University of Michigan, Ann Arbor, MI (US)

(72) Inventors: Bharan Giridhar, Ann Arbor, MI (US); David Theodore Blaauw, Ann Arbor, MI (US); Dennis Michael Sylvester, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 237 days.

(21) Appl. No.: 14/093,041

(22) Filed: Nov. 29, 2013

(65) Prior Publication Data

US 2015/0155014 A1 Jun. 4, 2015

(51) Int. Cl.
*G11C 7/12* (2006.01)
*G11C 7/08* (2006.01)

(52) U.S. Cl.
CPC ... *G11C 7/12* (2013.01); *G11C 7/08* (2013.01)

(58) Field of Classification Search
USPC .................................... 365/189.09, 203, 149
See application file for complete search history.

(56) References Cited

U.S. PATENT DOCUMENTS

| | | | | |
|---|---|---|---|---|
| 5,587,960 A | * | 12/1996 | Ferris | 365/230.03 |
| 5,701,268 A | * | 12/1997 | Lee et al. | 365/205 |
| 7,633,784 B2 | * | 12/2009 | Thummalapally | 365/49.12 |
| 2011/0204475 A1 | * | 8/2011 | Rui et al. | 257/532 |

OTHER PUBLICATIONS

D. Schinkel, et al., "A Double Tail Latch Type Voltage Sense Amplifier with 18ps Setup+Hold Time", *ISSCC*, 2007, 3 pgs.
N. Verman, "A High Density 45nm SRAM using Small-Signal Non-strobed Regenerative Sensing", *ISSCC*, 2008, 25 pgs.
M. Qazi, "A 512kb 8T SRAM macro operating down to 0.57 with an AN-coupled sense amplifier and embedded data retention voltage sensor in 45nm SOI CMOS", *ISSCC*, 2010, 4 pgs.
N. Verma, et al., "A 65nm 8T sub-vt SRAM Employing Sense-Amplifier Redundancy", *ISSCC*, 2007, 23 pgs.

* cited by examiner

*Primary Examiner* — Huan Hoang
*Assistant Examiner* — Minh Dinh
(74) *Attorney, Agent, or Firm* — Pramudji Law Group PLLC; Ari Pramudji

(57) ABSTRACT

Memory circuitry 2 includes an array 4 of bit cells 6. One or more boost capacitors C1, C2 are connected to bit lines 8 running through the array 4 and serve to store a sample charge with a sample voltage difference during a sampling configuration of the boost capacitors C1, C2. A boost configuration is subsequently adopted in which the boost capacitors C1, C2 are connected with a different plurality to respective bit lines 8 such that the sample voltage difference is added to the voltage change within the bit line produced by the bit line cell 6 so as to generate an increased magnitude change in voltage which is supplied to sense amplifier circuitry 12.

14 Claims, 7 Drawing Sheets

MEMORY CIRCUITRY INCLUDING READ VOLTAGE BOOST

BACKGROUND OF THE INVENTION

1. Field of the Invention

This invention relates to the field of memory circuitry. More particularly, this invention relates to the reading of bit line voltages during memory read operations.

2. Description of the Prior Art

It is known to provide memories comprising an array of bit cells having bit lines running therethrough. The bit lines are precharged to a precharge voltage and then selectively discharged in dependence upon data values being read from the memory. The discharge of the voltages on the bit lines is sensed with sense amplifier circuitry which latches the data values to the output.

A problem within such memory circuits is that as device size has become smaller it is more difficult to match the devices within the sense amplifier circuit resulting in offsets and other mismatches which degrade the performance of the sense amplifier circuitry. In order to deal with this memory designers typically heavy margin the time required for a sense amplifier to read and latch a bit line voltage. Such heavy margining restricts the performance of the memory. In particular, a longer read time may be required in order that a change in bit line voltage due to the selective discharge becomes large enough to overcome any mismatch within the sense amplifier circuitry and accordingly be properly detected and latched.

SUMMARY OF THE INVENTION

Viewed from one aspect the present invention provides a memory circuitry comprising:

an array of bit cells comprising a plurality of columns of bit cells;

a plurality of bit lines coupled to said plurality of columns of bit cells within said array;

sense amplifier circuitry configured to sense a voltage change on said at least one of said plurality of bit lines during a read operation;

at least one boost capacitor; and boost control circuitry configured to couple said at least one boost capacitor to said at least one of said plurality of bit lines in one of a plurality of configurations including:

(i) a sampling configuration in which said at least one boost capacitor is coupled to said at least one of said plurality of bit lines with a first polarity and an initial voltage change upon said at least one of said plurality of bit lines during said read operation produces a sampled charge with a sampled voltage difference to be stored by said at least one boost capacitor; and (ii) a boost configuration in which said at least one boost capacitor is coupled to said at least one of said plurality of bit lines with a second polarity, said second polarity is a reverse of said first polarity, and said sampled voltage difference is added to said said voltage change on said at least one of said plurality of bit lines and supplied to said sense amplifier circuitry.

The present technique uses one or more boost capacitors coupled to the bit lines running through the array of bit cells so as to boost the change in voltage that is supplied to the sense amplifier circuitry for sensing. The increased magnitude of the change in voltage makes it easier for the sense amplifier circuitry to properly sense the data value being read. This boosted voltage may be used to achieve higher performance in terms of read speed, or may be traded for more robustness by using it to decrease the rate of misreads. The technique uses boost control circuitry to connect the boost capacitor or capacitors to the bit line or bit lines in a configuration in which they first sample the initial changing voltage difference occurs. The boost control circuitry then switches to a boost configuration in which the connection of one or more boost capacitors is such that the voltage that they have sampled are added to the voltage change(s) which has occurred on the bit lines so that the change in voltage supplied to the sense amplifier has a greater magnitude making it easier to reliably sense and latch.

While it will be appreciated that the present techniques may be employed within a wide variety of different types of memory, such as, for example, 8T memory with one bit line for column of bit cells, the present technique may be used in embodiments when the columns of bit lines are coupled to respective bit line pairs and the sense amplifier circuitry is configured to sense of voltage difference between pairs and bit lines. The use of bit line pairs in this way has the advantage of increased resistance to common mode noise arising on the pairs of bit lines.

Within the context of embodiments employing bit line pairs, the sense amplifier circuitry typically senses a difference between the voltages on the bit lines of a pair. In some embodiments the boost control circuitry serves to connect the boost capacitor between the pair of bit lines in the sampling configuration such that the initial voltage difference between the bit lines is stored within the boost capacitor.

After the boost capacitor has stored a sample voltage, this sample voltage may be added to the voltage drop occurring on one of the bit lines by connecting the boost capacitor in series with the bit line concerned. Accordingly, in some embodiments the boost control circuitry may be configured to first connect the boost capacitor between the pair of bit lines and then connect the boost capacitor in series with one of the bit lines.

As memories employing bit line pairs typically discharge one of the bit lines of the pair while leaving the other of the bit lines undischarged, it is desirable to boost voltage change whether it occurs on either of the bit lines of the pair. In order to facilitate this, some embodiments include a pair of boost capacitors which are in the sampling mode connected between the bit lines and then during the boost mode are each connected in series with a respective one of the bit lines such that a voltage change on either of the bit lines will be boosted by the boost capacitor which is at that time connected in series with that bit line. Furthermore, the bit line which has not been discharged will by action of the boost capacitor with that bit line have its voltage changed in the opposite direction to the normal discharge change and accordingly a greater total of difference will arise between the voltages supplied to the sense amplifier circuitry via the bit line pair for sensing.

The boost control circuitry may be configured in some embodiments to couple the at least one capacitor to the plurality bit lines in a sequence of: sampling configuration followed by boost configuration during the read operation.

In some embodiments the boost control circuitry may be configured to provide a connection between the at least one of the bit lines and the sense amplifier circuitry via a bit line switch (such as a transistor) during the sampling operation and to break this connection during the boost operation. This arrangement facilitates the reconfiguration of the connection between the boost capacitor and the bit line in a manner appropriate to first perform the sampling and then the boosting of the voltage supplied to the sense amplifier circuitry.

In some embodiments the boost capacitor may be at least one of metal, poly-silicon, diffusion and/or trench capacitors. In some embodiments the boost capacitor may be formed as two metal layers separated by a metal oxide layer as such capacitors are readily incorporated with the structure of a memory. Other forms of capacitor may also be used.

The incorporation of the boost capacitors within the memory may be facilitated when the boost capacitor is provided with a physical pitch dimension which is substantially equal to the pitch dimension of the sense amplifier circuitry excluding that boost capacitor. Accordingly, the provision of the boost capacitor need not impact the density at which the memory may be formed.

While it will be appreciated that the bit cells of the array which use the present techniques may have a variety of different forms, in some embodiments these bit cells are 6T bit cells (six transistor bit cells).

Viewed from another aspect the present invention provides a memory circuitry comprising:

an array of bit cell means for storing data, said array of bit cell means comprising a plurality of columns of bit cell means;

a plurality of bit line means for coupling to said plurality of columns of bit cell means within said array;

sense amplifier means for sensing a voltage change on said at least one of said plurality of bit line means during a read operation;

at least one boost capacitor means for storing charge; and boost control means for coupling said at least one boost capacitor means to said at least one of said plurality of bit line means in one of a plurality of configurations including:

(i) a sampling configuration in which said at least one boost capacitor means is coupled to said at least one of said plurality of bit line means with a first polarity and an initial voltage change upon said at least one of said plurality of bit line means during said read operation produces a sampled charge with a sampled voltage difference to be stored by said at least one boost capacitor means; and (ii) a boost configuration in which said at least one boost capacitor means is coupled to said at least one of said plurality of bit line means with a second polarity, said second polarity is a reverse of said first polarity, and said sampled voltage difference is added to said voltage change on said at least one of said plurality of bit line means and supplied to said sense amplifier means.

Viewed from a further aspect the present invention provides a method of operating memory circuitry comprising:

storing data within an array of bit cells, said array of bit cells comprising a plurality of columns of bit cells;

providing a plurality of bit lines coupled to said plurality of columns of bit cells within said array;

sensing with sense amplifier circuitry a voltage change on said at least one of said plurality of bit line means during a read operation;

storing charge within at least one boost capacitor; and coupling said at least one boost capacitor means to said at least one of said plurality of bit lines in one of a plurality of configurations including:

(i) a sampling configuration in which said at least one boost capacitor is coupled to said at least one of said plurality of bit lines with a first polarity and an initial voltage change upon said at least one of said plurality of bit lines during said read operation produces a sampled charge with a sampled voltage difference to be stored by said at least one boost capacitor; and (ii) a boost configuration in which said at least one boost capacitor is coupled to said at least one of said plurality of bit lines with a second polarity, said second polarity is a reverse of said first polarity, and said sampled voltage difference is added to said said voltage change on said at least one of said plurality of bit lines and supplied to said sense amplifier circuitry.

The above, and other objects, features and advantages of this invention will be apparent from the following detailed description of illustrative embodiments which is to be read in connection with the accompanying drawings.

DESCRIPTION OF THE EMBODIMENTS

Figure 1:
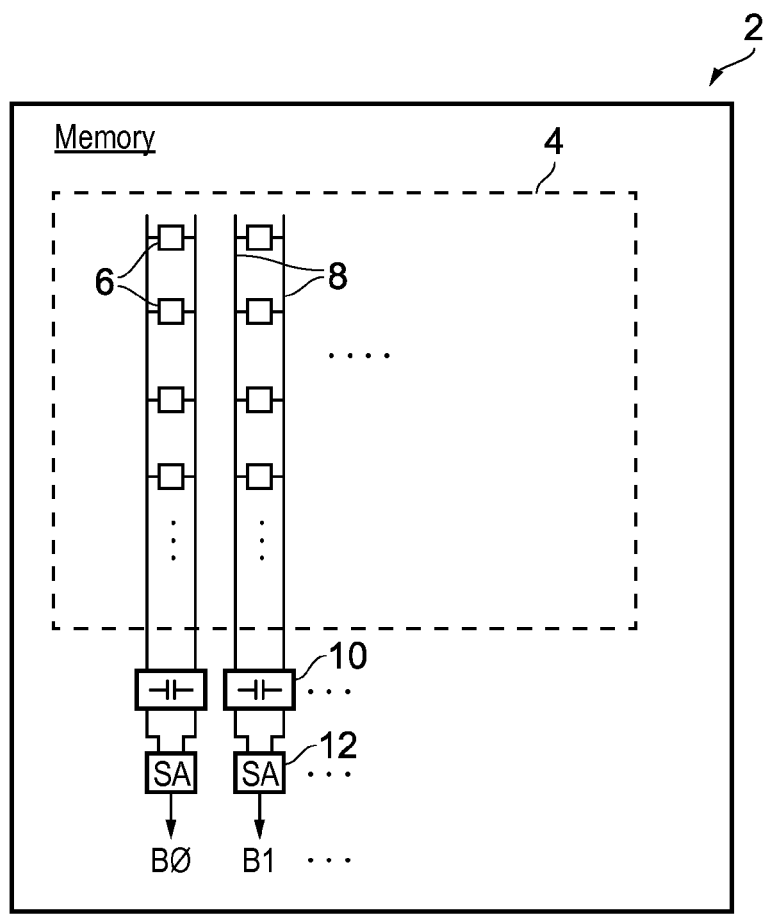
FIG. 1 schematically illustrates a memory including an array of bit cells connected via bit lines.

FIG. 1 schematically illustrates memory circuitry 2 including an array 4 of bit cells 6. The bit cells 6 are arranged in columns which are, in this example embodiment, connected via respective pairs of bit lines 8. Boost circuitry 10 is connected to each bit line pair 8 and includes one or more boost capacitors together with boost control circuitry for controlling the configuration with which these one or more boost capacitors are coupled to the bit lines 8. The output from the boost circuitry 10 is supplied to respective sense amplifier circuitry 12 where a difference in the voltage levels between the signals supplied to the sense amplifying circuitry 12 is read and latched for output as a data value.

Figure 2:
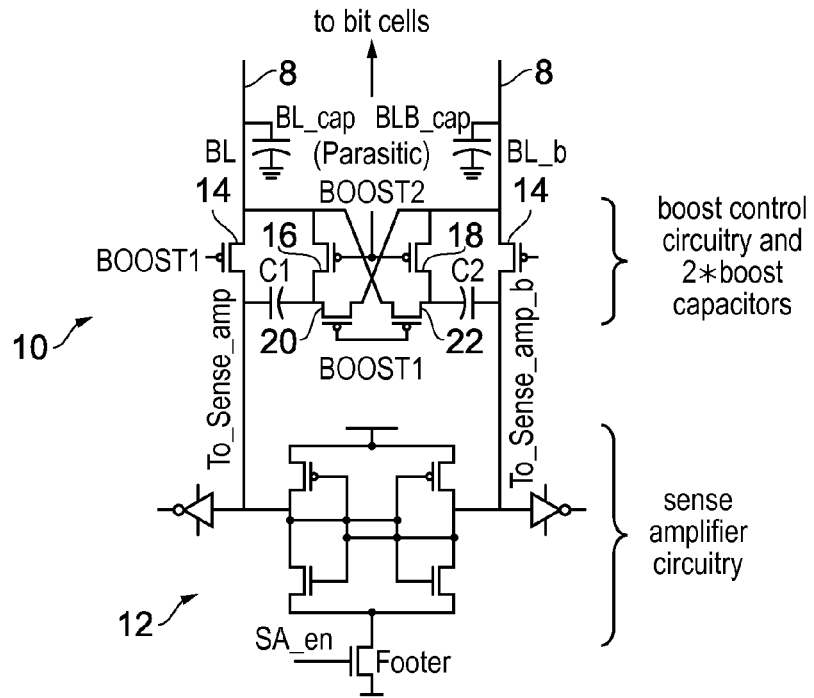
FIG. 2 schematically illustrates an example embodiment of boost control circuitry and boost capacitors connected to sense amplifier circuitry.

FIG. 2 schematically illustrates one example embodiment including sense amplifier circuitry 12 in the form of cross-coupled inverters enabled by a sense amplifier enable signal SA_EN. The bit lines 8 constituting a bit line pair for a column of bit cells have associated with them a parasitic capacitance. The bit lines 8 are connected to boost circuitry 10 which includes boost control circuitry and, in this example embodiment, two boost capacitors. C1, C2. The boost control circuitry is controlled by two control signals Boost1, Boost2. A bit line switch 14 is provided in respect of each of the bit lines 8 and serves to either provide a connection between the bit line 8 and the sense amplifier circuitry 12 via the bit line switch 14 or to break this connection. The connection is closed (transistors 14 in a low impedance state) when the boost capacitors C1 and C2 are configured in the sampling configuration. The bit line switches 14 break the connection (transistors in a high impedance state) when the boost capacitors C1 and C2 are in their boost configuration.

The boost control circuitry further includes PMOS transistors 16, 18, 20, 22 which serve to first connect the boost capacitors C1 and C2 between the bit lines 8 with a first polarity during the sampling configuration and then connect the boost capacitors C1 and C2 in series with respective ones of the bit lines 8 during the boost configuration.

It will be appreciated that the circuitry of FIG. 2 achieves an increase in the magnitude of the voltage difference supplied to the sense amplifier circuitry 12 using passive techniques, namely capacitors which first store charge and then switch to apply a voltage boost.

Figure 3:
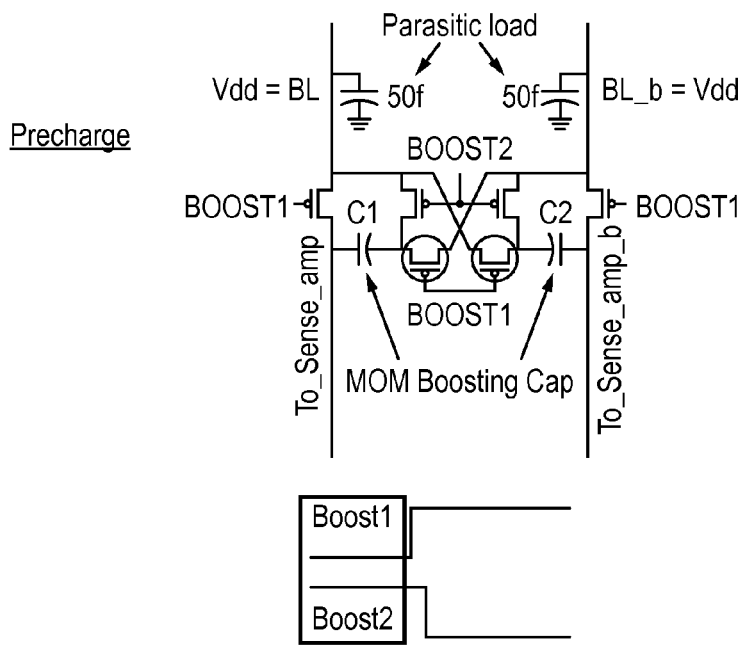
FIG. 3 schematically illustrates the circuitry of FIG. 2 operating during precharge of the bit lines.

FIG. 3 schematically illustrates the circuitry of FIG. 2 during precharge of the bit lines 8. During this phase of operation the control signal Boost1 is low and the control signal Boost2 is high. The bit lines 8 are both charged high and accordingly there is no voltage difference between the bit lines. The transistors 20 and 22 are in a low impedance state and the voltage across each of the boost transistors C1 and C2 is substantially zero.

The form of the boost capacitors C1 and C2 may be at least one of metal, poly-silicon, diffusion and/or trench capacitors. In some embodiments the boost capacitors C1 and C2 may be two metal layers separated by a metal oxide layer formed in one of the upper fabrication layers of the integrated circuit. In other embodiments the upper metal layer may be used for routing and power such that the capacitors are formed using metal layers below the top and/or layers that are not metal. The boost capacitors C1, C2 may be formed to have a pitch dimension which is substantially equal to the pitch dimension of the sense amplifier circuitry 12 provided for each column excluding the boost capacitors. Matching the pitch dimension of the boost capacitors to that of the sense amplifier circuitry has the result that the provision of the boost capacitors C1, C2 need not impact the memory density that may be achieved.

The capacitance of the boost capacitors C1 and C2 is a design parameter to be selected for each implementation. The design trade offs to be used are:

1. As the parasitic load increases, the boost gain decreases and accordingly it would be desirable to increase the size of the boost capacitor.
2. As the size of the boost capacitor increases, the original bit line differential decreases (due to added load) and hence this would suggest a decrease in the capacitance of the boost capacitor. Further, smaller boost capacitors will result in reduced coupling, which will to some extent attenuate the input bit line swing and act against the benefit of voltage boosting.

In one example embodiment the present techniques may use boost capacitors of approximately 5 fF and may be implemented as 7.8 μm*0.76 μm metal-oxide-metal devices. These capacitors are pitch-match to the sense amplifier circuitry 12 and may be placed on top of the bit cell columns in the metal5 and metal6 layers.

Figure 4:
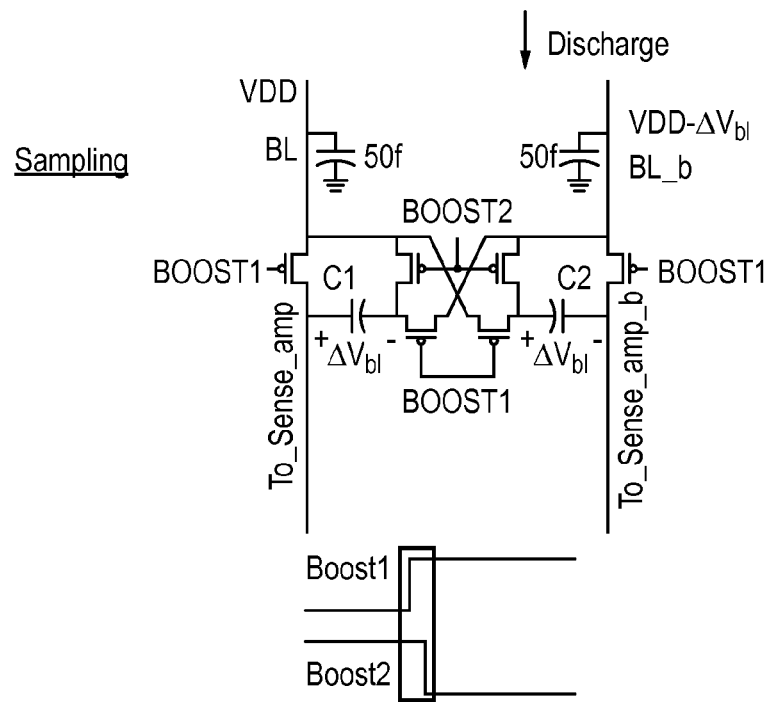
FIG. 4 schematically illustrates the circuitry of FIG. 2 operating with a sampling configuration.

FIG. 4 schematically illustrates the operation of the circuitry of FIG. 2 during the sampling configuration. When the word line for a row of bit cells in the array 4 is activated (i.e. a read is initiated), then one of the bit lines 8 will start to discharge. In this example embodiment, the bit line BL_B begins to discharge. At this time, a difference in voltage level arises between the two bit lines 8. This difference in voltage is stored across the boost transistors C1 and C2 as shown. This voltage difference is a sampled voltage difference and corresponds to a sampled charge being stored by each of the boost capacitors C1 and C2. The sample voltages have the polarities indicated in FIG. 4. These polarities are relative to the bit line to which each of the respective boost capacitors C1 and C2 is connected. At the end of the sampling configuration, the control signal Boost1 goes high and the voltage change on the bit line which is discharging is sampled into the boost capacitors C1 and C2. It should be noted that in this example embodiment, bottom plate sampling is not used as charging injection will take place on either C1 or C2.

FIG. 3 schematically illustrates the circuitry of FIG. 2 during operation with the boost configuration. At this time the control signal Boost2 goes low. A boosted differential voltage achieved between the two bit lines 8 is approximately equal to three times the change in voltage which occurred upon the bit line 8 which was discharged. In particular, the bit line which was discharging is supplied to the sense amplifier circuitry 12 and is subject to the voltage drop both arising at the bit line before the action of the boost circuitry 10 and the sampling voltage which has been sampled into boost capacitor C2. The other of the bit lines has not been discharged by action of one of the bit cells, but is nevertheless subject to a changed voltage as supplied to the sense amplifier by coupling of the sample voltage stored within the boost capacitor C1 to the signal supplied to the sense amplifier circuitry 12.

It should be noted that the input to the sense amplifier circuitry 12 is the difference between the signals supplied to it and is AC coupled thereto such that as the difference continues to increase between the bit lines, as driven by the bit cells, this increase continues to be supplied to the sense amplifier circuitry 12. The parasitic capacitance of the bit lines running through the array facilitates this behaviour and thus larger arrays with longer bit lines and larger parasitic capacitances will benefit increasingly from the use of these techniques.

The sense enable signal SA_en may be switched on sometime after the boost configuration has been adopted in order to read the voltage differential which is being supplied to the sense amplifier circuitry 12 and latch this for output as a data value.

The sense amplifier circuitry 12 comprising cross-coupled inverters will itself further amplify the voltage difference using regenerative feedback. During such latching the boost capacitors C1, C2 are isolated by the activating column mux switches (not shown in FIG. 2 but may be placed in the bit lines between the boost circuitry 20 and the sense amplifier circuitry 12). The use of these mux switches (transistors) assists in preventing degradation of the amplification slew of the sense amplifying circuitry 12.

Figure 6:
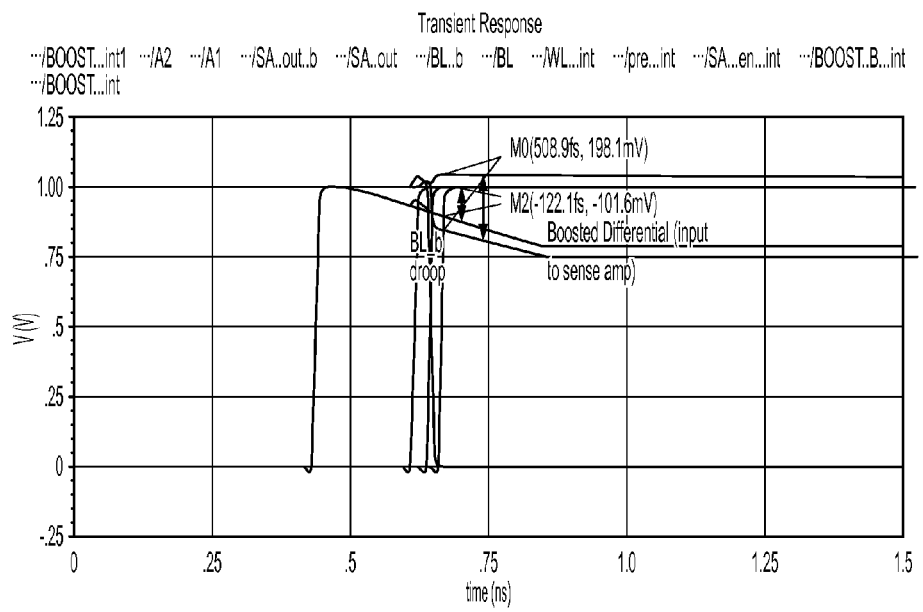
FIG. 6 is a signal diagram illustrating a simulation of signals arising during the operation of circuitry of FIG. 2.

FIG. 6 is a signal diagram illustrating a simulation of signals arising during a simulation of the operation of the circuitry of FIG. 2. The waveforms show the parasitic boosting of the bit line differential due to the action of the boost capacitors C1, C2. As the voltage boosting provides pre-amplification to the signal supplied to the sense amplifier circuitry 12, this pre-amplification can be used to overcome offset arising within the sense amplifier circuitry 12 due to device mismatch and accordingly reduce the sensitivity of the memory to such device mismatch. This can permit the devices to be used to form the sense amplifier circuitry 12 to be near minimum-sized for the manufacturing process for the memory and accordingly increase the memory density which may be achieved.

Figure 7:
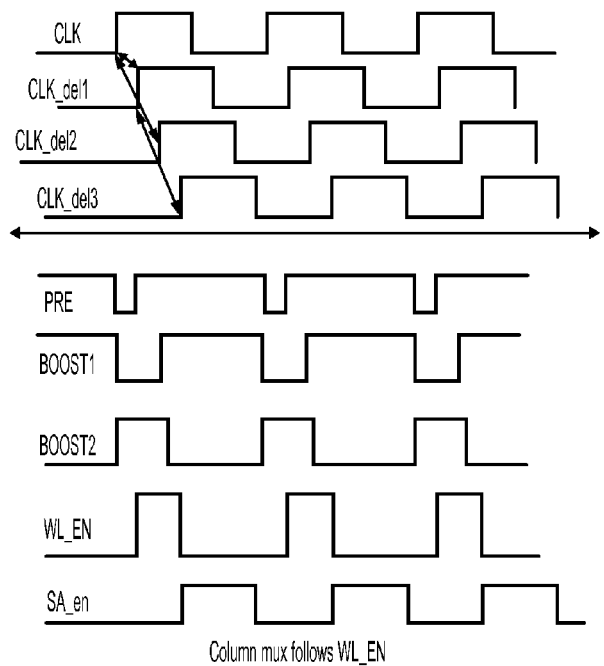
FIG. 7 is a signal diagram schematically illustrating control signals for controlling the operation of a circuitry of FIG. 2.

FIG. 7 schematically illustrates signals used to control the boost control circuitry and the boost capacitors C1, C2 forming the boost circuitry 10. Further signals are illustrated for controlling the precharge PRE, the read WL_EN, and the sense amplifier enable SA_EN. A clock signal CLK is supplied to control the overall operation of the memory circuitry and there Re delayed forms of this clock signal used to generate the control signals illustrated in FIG. 7.

Figure 5:
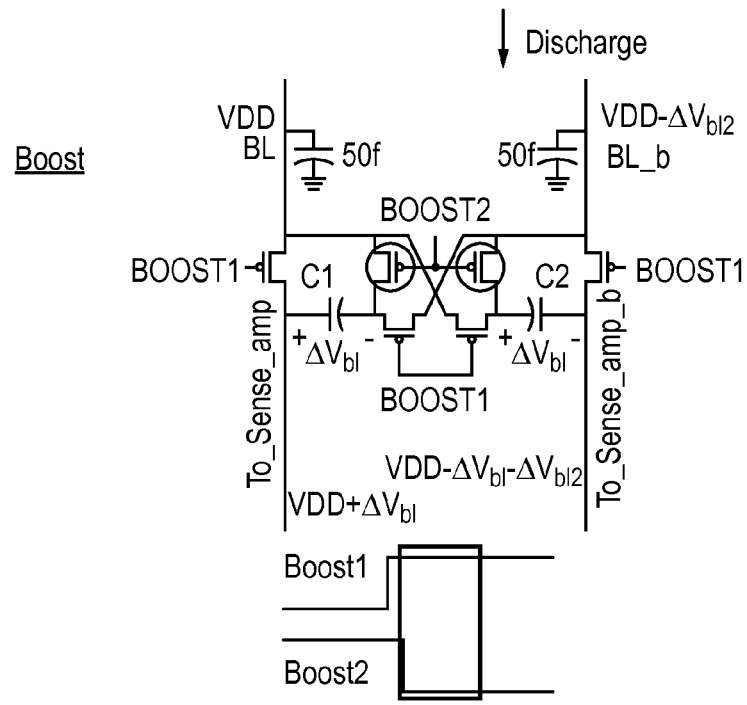
FIG. 5 is a diagram schematically illustrating the circuitry of FIG. 2 operating with a boost configuration.

The relative timing of the control signals Boost1 and Boost2 used to control the boost circuitry 10 are illustrated in FIGS. 3, 4 and 5 discussed above.

Figure 8:
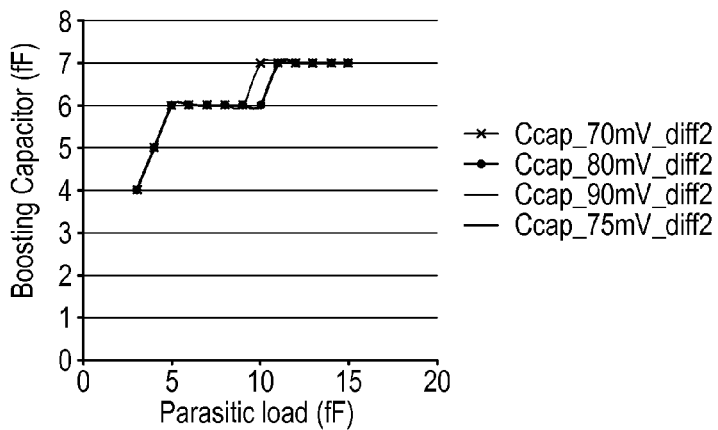
FIGS. 8, 9 and 10 are diagrams illustrating simulated results showing improvements in performance which may be achieved in at least some examples of the use of the present techniques.

FIG. 8 illustrates the simulated size of the boosting capacitors C1 and C2 as a function of the bit line and parasitic load for various baseline differential voltages to be achieved.

Figure 9:
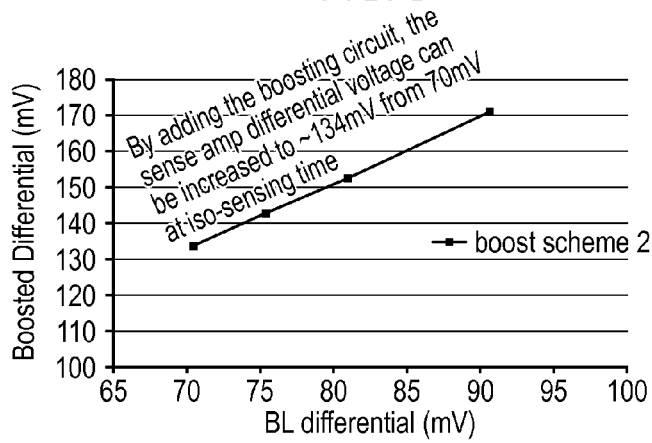
Figure 10:
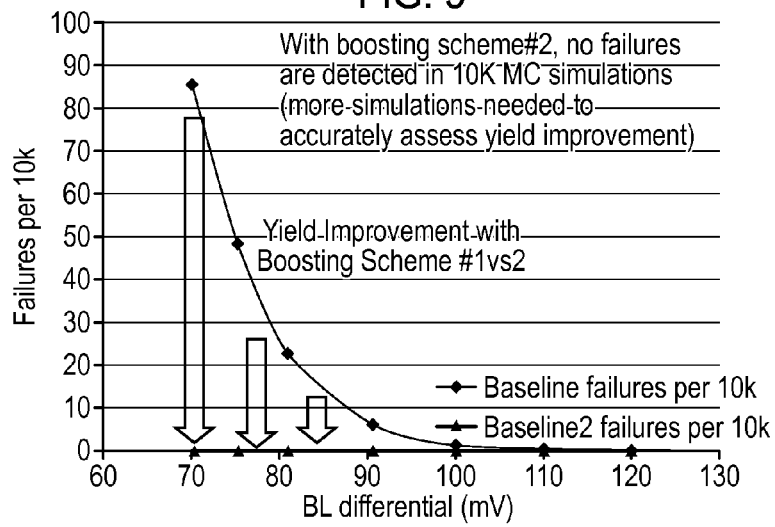

FIGS. 9 and 10 shows simulated results using an iso-sensing time. The bit line differential voltage can be boosted from 70 mV to approximately 134 mV as illustrated in FIG. 9 and this improves the failure rate as illustrated in FIG. 10. The increased robustness can also be traded off for approximately 20 to 25% increase in sensing speed.

Figure 11:
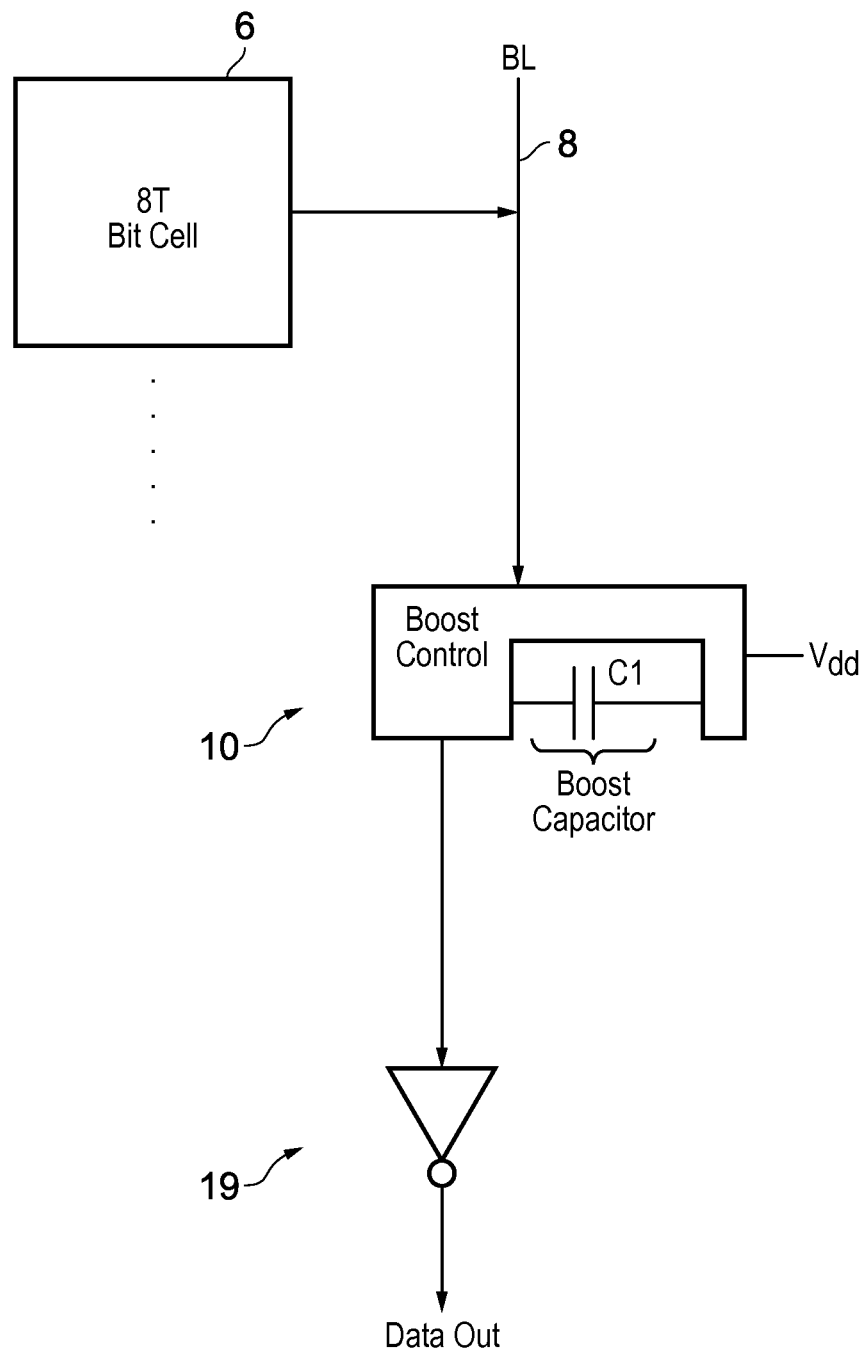
FIG. 11 is a diagram schematically illustrating the use of the present techniques in an example embodiment in which each column of bit cells is associated with a single bit line.

FIG. 11 schematically illustrates a second example embodiment. In this example an 8T bit cell 6 (eight transistor) is used coupled to a single bit line 8. Boost circuitry 10 incorporates boost control circuitry and a boost capacitor C1. This boost capacitor C1 can be used to sense (sample) an initial fall in the bit line voltage and then store and apply this bit line voltage in addition to the existing fall and bit line voltage to generate a signal to be supplied to an inverter 19.

It will be appreciated that the present techniques may be used with memories which utilise one bit line per column of bit cells in addition to those using a pair of bit lines for a column of bit cells. It will be further appreciated that the number of boost capacitors used can vary between implementations.

Figure 12:
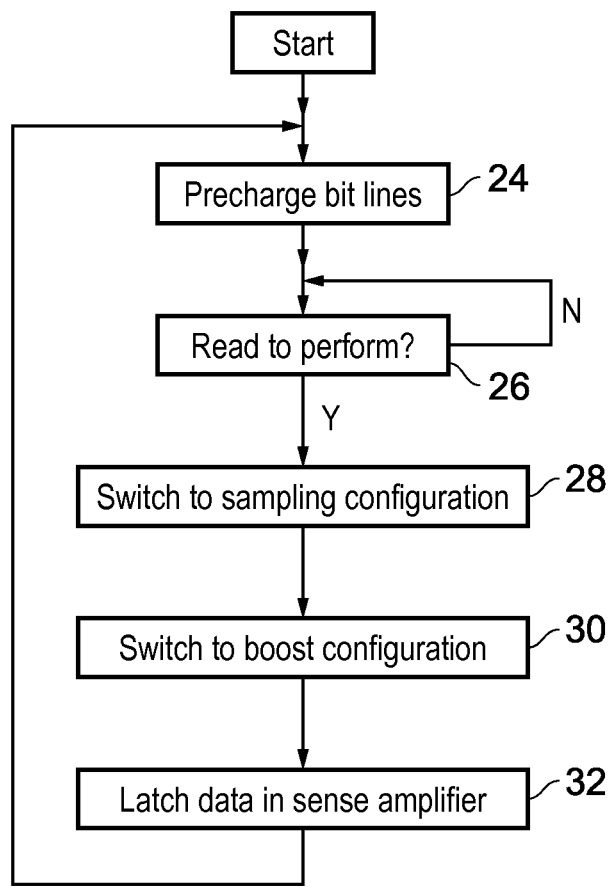
FIG. 12 is a flow diagram schematically illustrating the operation of the circuitry of FIG. 2.

FIG. 12 is a flow diagram schematically illustrating the operation of FIG. 2. At step 24 the bit lines 8 are precharged to a high level. Processing waits at step 26 until there is a read to perform. When there is a read to perform, the boost control circuitry 14, 16, 18, 20, 22 in the form of the various transistors illustrated in FIG. 2 serves to switch to a sampling configuration for the connection of the boost capacitors C1 and C2 to the bit lines 8 at step 28. In the sampling configuration a sampling charge is stored into the boost capacitors C1 and C2 and a sampling voltage develops across those capacitors. At step 30 the boost control circuitry 14, 16, 18, 20, 22 serves to switch the capacitors into a boost configuration. In this boost configuration the sample voltages added to the voltage change on the bit line concerned to generate a voltage change supplied to the sense amplifier circuitry 12 which has an increased magnitude. At step 32 the sense amplifier circuitry 12 latches the data value to be read based upon the voltage difference between the signals supplied to the sense amplifier circuitry 12 in the case of the embodiment of FIG. 2 using a pair of bit lines 8.

We claim:

1. Memory circuitry comprising:
   an array of bit cells comprising a plurality of columns of bit cells;
   a plurality of bit lines coupled to said plurality of columns of bit cells within said array;
   sense amplifier circuitry configured to sense a voltage change on at least one of said plurality of bit lines during a read operation;
   at least one boost capacitor; and
   boost control circuitry configured to couple said at least one boost capacitor to said at least one of said plurality of bit lines in one of a plurality of configurations including:
   (i) a sampling configuration in which said at least one boost capacitor is coupled to said at least one of said plurality of bit lines with a first polarity and an initial voltage change upon said at least one of said plurality of bit lines during said read operation produces a sampled charge with a sampled voltage difference to be stored by said at least one boost capacitor; and
   (ii) a boost configuration in which said at least one boost capacitor is coupled to said at least one of said plurality of bit lines with a second polarity, said second polarity is a reverse of said first polarity, and said sampled voltage difference is added to said voltage change on said at least one of said plurality of bit lines and supplied to said sense amplifier circuitry.

2. Memory circuitry as claimed in claim 1, wherein said columns of bit cells are coupled to respective bit line pairs and said sense amplifier circuitry is configured to sense a voltage difference between a pair of bit lines.

3. Memory circuitry as claimed in claim 2, wherein said boost control circuitry is configured to connect said boost capacitor between said pair of bit lines in said sampling configuration.

4. Memory circuitry as claimed in claim 2, wherein said boost control circuitry is configured to connect said boost capacitor in series with one of said pair of bit lines in said boost configuration.

5. Memory circuitry as claimed in claim 2, wherein a pair of boost capacitors are connected to said pair of bit lines under control of said boost control circuitry.

6. Memory circuitry as claimed in claim 5, wherein said boost control circuitry is configured to connect each of said pair of boost capacitors between said pair of bit lines in said sampling configuration.

7. Memory circuitry as claimed in claim 5, wherein said boost control circuitry is configured to connect each of said pair of boost capacitors in series with a respective different one of said pair of bit lines in said boost configuration.

8. Memory circuitry as claimed in claim 1, wherein said boost control circuitry is configured to couple said at least one boost capacitor to said at least one of said plurality of bit lines in a sequence of said sampling configuration followed by said boost configuration during said read operation.

9. Memory circuitry as claimed in claim 1, wherein said boost control circuitry is configured to:
   (i) provide a connection between said at least one of said plurality of bit lines and said sense amplifier circuitry via a bit line switch during said sampling configuration; and
   (ii) break said connection between said at least one of said plurality of bit lines and said sense amplifier circuitry using said bit line switch during said boost configuration.

10. Memory circuitry as claimed in claim 1, wherein said boost capacitor is formed of two metal layers separated by a metal oxide layer.

11. Memory circuitry as claimed in claim 1, wherein said boost capacitor has a pitch dimension substantially equal to a pitch dimension of said sense amplifier circuitry excluding said boost capacitor.

12. Memory circuitry as claimed in claim 1, wherein said array of bit cells comprised an array of 6T bit cells.

13. Memory circuitry comprising:
   an array of bit cell means for storing data, said array of bit cell means comprising a plurality of columns of bit cell means;
   a plurality of bit line means for coupling to said plurality of columns of bit cell means within said array;
   sense amplifier means for sensing a voltage change on at least one of said plurality of bit line means during a read operation;
   at least one boost capacitor means for storing charge; and boost control means for coupling said at least one boost capacitor means to said at least one of said plurality of bit line means in one of a plurality of configurations including:
  (i) a sampling configuration in which said at least one boost capacitor means is coupled to said at least one of said plurality of bit line means with a first polarity and an initial voltage change upon said at least one of said plurality of bit line means during said read operation produces a sampled charge with a sampled voltage difference to be stored by said at least one boost capacitor means; and
  (ii) a boost configuration in which said at least one boost capacitor means is coupled to said at least one of said plurality of bit line means with a second polarity, said second polarity is a reverse of said first polarity, and said sampled voltage difference is added to said voltage change on said at least one of said plurality of bit line means and supplied to said sense amplifier means.

14. A method of operating memory circuitry comprising:
storing data within an array of bit cells, said array of bit cells comprising a plurality of columns of bit cells;
providing a plurality of bit lines coupled to said plurality of columns of bit cells within said array;
sensing with sense amplifier circuitry a voltage change on at least one of said plurality of bit line means during a read operation;
storing charge within at least one boost capacitor; and
coupling said at least one boost capacitor means to said at least one of said plurality of bit lines in one of a plurality of configurations including:
  (i) a sampling configuration in which said at least one boost capacitor is coupled to said at least one of said plurality of bit lines with a first polarity and an initial voltage change upon said at least one of said plurality of bit lines during said read operation produces a sampled charge with a sampled voltage difference to be stored by said at least one boost capacitor; and
  (ii) a boost configuration in which said at least one boost capacitor is coupled to said at least one of said plurality of bit lines with a second polarity, said second polarity is a reverse of said first polarity, and said sampled voltage difference is added to said voltage change on said at least one of said plurality of bit lines and supplied to said sense amplifier circuitry.

* * * * *